(12) United States Patent
Courter et al.

(10) Patent No.: US 10,102,695 B2
(45) Date of Patent: Oct. 16, 2018

(54) SYSTEM AND METHOD FOR SPREAD-SPECTRUM TIME-DOMAIN REFLECTOMETRY AND DESIGN DATA WIRE TESTING

(71) Applicant: The Boeing Company, Chicago, IL (US)

(72) Inventors: Brandon M. Courter, Mt. Pleasant, SC (US); Nam V. Ngo, Summerville, SC (US); Scott C. Farner, Daniel Island, SC (US); Joseph M. Dray, Mt. Pleasant, SC (US); Terrance Lee Thomas, Woodinville, IL (US)

(73) Assignee: THE BOEING COMPANY, Chicago, IL (US)

( * ) Notice: Subject to any disclaimer, the term of this patent is extended or adjusted under 35 U.S.C. 154(b) by 5 days.

(21) Appl. No.: 15/298,900

(22) Filed: Oct. 20, 2016

(65) Prior Publication Data

US 2018/0114382 A1 Apr. 26, 2018

(51) Int. Cl.
| | |
|---|---|
| G07C 5/08 | (2006.01) |
| G01R 31/11 | (2006.01) |
| G01R 31/04 | (2006.01) |
| G01R 31/00 | (2006.01) |
| B60R 16/023 | (2006.01) |

(52) U.S. Cl.
CPC .......... *G07C 5/0816* (2013.01); *B60R 16/023* (2013.01); *G01R 31/008* (2013.01); *G01R 31/04* (2013.01); *G01R 31/11* (2013.01)

(58) Field of Classification Search
CPC .. G07C 5/0816; B60R 16/023; G01R 31/008; G01R 31/11; G01R 31/04
See application file for complete search history.

(56) References Cited

U.S. PATENT DOCUMENTS

| | | |
|---|---|---|
| 2010/0063754 A1 | 3/2010 | Thomas et al. |
| 2011/0153235 A1 | 6/2011 | Thomas et al. |
| 2017/0199235 A1* | 7/2017 | Jeon ..................... G01R 31/021 |

\* cited by examiner

*Primary Examiner* — Yuen H Wong
(74) *Attorney, Agent, or Firm* — Parsons Behle & Latimer

(57) ABSTRACT

A method for wire connectivity testing includes receiving wiring data indicating at least a length of a wire segment of a vehicle from a design database. The method further includes receiving spread-spectrum time-domain reflectometry (SSTDR) data associated with the wire segment from an SSTDR device coupled to an endpoint of the wire segment. The method also includes calculating a distance-to-fault based on the SSTDR data. The method includes comparing the distance-to-fault to the length of the wire segment. The method further includes, in response to the distance-to-fault being less than the length of the wire segment, generating fault data indicating a failure within the wire segment. The method also includes sending the fault data to a user output device.

10 Claims, 9 Drawing Sheets

SYSTEM AND METHOD FOR SPREAD-SPECTRUM TIME-DOMAIN REFLECTOMETRY AND DESIGN DATA WIRE TESTING

FIELD OF THE DISCLOSURE

This disclosure relates generally to the field of spread-spectrum time-domain reflectometry (SSTDR) and more particularly to using SSTDR data and design data in wire testing.

BACKGROUND

In vehicle manufacturing, it is important to ensure continuity in electrical wires between electrical systems. Extensive testing is typically performed to ensure that all wires through a vehicle have been properly connected and are undamaged. One way to perform continuity testing is through the use of an ohmmeter, or another type of two sided circuit test. However, for large vehicles, this requires technicians to possess great expertise in order to properly place probes to test particular connections. It also takes a great amount of time to narrow a discovered discontinuity to a particular wire or connector.

Another way to perform testing is through the use of an SSTDR system. SSTDR systems are one sided and may be used to discover a distance to a discontinuity within a wire. However, SSTDR systems have limited information regarding the structure of the system-under-test and provide no indication of a location of a discontinuity relative to the vehicle. As such, SSTDR systems alone may be insufficient to quickly locate a failure within a wire segment.

SUMMARY

In an embodiment, a method for wire connectivity testing includes receiving wiring data indicating at least a length of a wire segment of a vehicle from a design database. The method further includes receiving SSTDR data associated with the wire segment from an SSTDR device coupled to an endpoint of the wire segment. The method also includes calculating a distance-to-fault based on the SSTDR data. The method includes comparing the distance-to-fault to the length of the wire segment. The method further includes, in response to the distance-to-fault being less than the length of the wire segment, generating fault data indicating a failure within the wire segment. The method also includes sending the fault data to a user output device.

In some embodiments, the method includes receiving additional wiring data indicating one or more additional wire segments that follow a same path as the wire segment. The method may further include selecting a second wire segment from the one or more additional wire segments for use as a parallel wire segment to enable the SSTDR data to be generated. In some embodiments, the method includes receiving additional wiring data indicating at least one material of the wire segment and associated connectors. The method may also include determining a type of failure based on the SSTDR data and the at least one material. The type of failure may correspond to an open circuit, a shorted circuit, or a damaged circuit. The fault data may indicate the type of failure. In some embodiments, the method includes receiving additional wiring data indicating a path of the wire segment within the vehicle from the design database. The method may further include generating 3-point vehicle coordinates indicating a position of the failure within the vehicle based on the path and based on the distance-to-fault. The fault data may indicate the 3-point vehicle coordinates.

In some embodiments, the method includes receiving vehicle data from the design database. The vehicle data may include 3-dimensional visualization information associated with the vehicle. The method may further include generating a 3-dimensional visualization of the vehicle indicating a position of the failure within the vehicle based on the 3-dimensional visualization information and based on the 3-point vehicle coordinates. The fault data may include the 3-dimensional visualization. In some embodiments, the method includes receiving additional wiring data indicating positions of one or more electrical connectors associated with the wire segment. The method may further include comparing the distance-to-fault with the positions of each of the one or more electrical connectors to determine whether the failure is associated with a particular electrical connector of the one or more of the electrical connectors. The fault data may indicate the particular electrical connector.

In some embodiments, the method includes iteratively coupling the SSTDR device to endpoints of additional wire segments within a same wire harness as the wire segment. The method may also include receiving additional SSTDR data associated with each of the additional wire segments from the SSTDR device. The method may further include calculating additional distance-to-faults associated with each of the additional wire segments based on the additional SSTDR data. The method may include comparing the additional distance-to-faults to additional lengths of the additional wire segments to determine whether additional failures have occurred within the additional wire segments. The fault data may indicate the additional failures. In some embodiments, the method includes, in response to failures occurring in each wire segment associated with an electrical connector, generating additional fault data indicating that the electrical connector is disconnected. In some embodiments, the method includes in response to failures occurring in fewer than each wire segment of an electrical connector, generating additional fault data indicating that one or more connection pins of an electrical connector is recessed, damaged, or swapped.

In an embodiment, a system includes an SSTDR device selectively coupled, via testing hardware, to at least one endpoint of a wire segments of a vehicle. The system further includes a design database storing wiring data. The wiring data indicates at least a length of the one or more wire segments. The system also includes a processor and a memory. The memory stores instructions that, when executed by the processor, cause the processor to receive the wiring data from the design database. The instructions also cause the processor to receive SSTDR data associated with the wire segment from the SSTDR device. The instructions further cause the processor to calculate a distance-to-fault based on the SSTDR data. The instructions cause the processor to, in response to the distance-to-fault being greater than a connection length through the testing hardware and less than the sum of the connection length and the length of the wire segment, determine that a failure has occurred within the wire segment and generate fault data indicating the failure.

In some embodiments, the testing hardware includes a switching matrix coupled between the SSTDR device and the one or more endpoints. The testing hardware may further include a testing wire harness coupled between the SSTDR device and the one or more endpoints. The testing hardware may also include an electrical connector configured to couple the wire harness to the wire segment. In some embodiments, the instructions further cause the processor to, in response to the distance-to-fault being less than a length of an electrical path through the testing hardware, determine whether a failure occurred within the switching matrix, within the testing wire harness, or within the electrical connector. In some embodiments, the instruction further cause the processor to, in response to the failure occurring within the wire segment, iteratively couple the SSTDR device to endpoints of additional wire segments within a same wire harness as the wire segment, retrieve additional SSTDR data associated with each of the additional wire segments from the SSTDR device, calculate additional distance-to-faults associated with each of the additional wire segments based on the additional SSTDR data, and determining whether additional failures have occurred within the additional wire segments.

In some embodiments, the instructions further cause the processor to, in response to failures occurring in each wire segment associated with an electrical connector, generate additional fault data indicating that the electrical connector is disconnected. In some embodiments, the instructions further cause the processor to, in response to the failures occurring in fewer than each wire segment of an electrical connector, generate additional fault data indicating that one or more connection pins of an electrical connector is recessed, damaged, or swapped. In some embodiments, the instructions further cause the processor to, generate fault data indicating a failure type, a failure position, a failure visualization, or a combination thereof, and send the fault data to a user output device.

In some embodiments, the system includes additional testing hardware selectively coupling the SSTDR device to another end point of the wire segment. The instructions may further cause the processor to, in response to the distance-to-fault being greater than the sum of the connection length and the length of the wire segment, determine that a failure has occurred within the additional hardware. In some embodiments, the instructions further cause the processor to retrieve additional SSTDR data associated with the wire segment from the SSTDR device. The additional SSTDR data may be measured via the additional testing hardware selectively coupling the SSTDR device to the second end point. The instructions may further cause the processor to calculating an additional distance-to-fault based on the additional SSTDR data. The instructions may also cause the processor to determining whether the failure occurred within a switching matrix, within a wire harness, or within an electrical connector, of the additional testing hardware based on the additional distance-to-fault.

In an embodiment, a non-transitory computer-readable medium stores instructions that, when executed by a processor, cause the processor to receive a user selection of a vehicle, a first electrical connector, a connection pin of the first electrical connector, and a second electrical connector, to identify a wire segment of the vehicle. The instructions further cause the processor to receive wiring data indicating at least a length of the wire segment from a design database. The instructions also cause the processor to receive SSTDR data associated with the wire segment from an SSTDR device coupled to the connection pin of the first electrical connector. The instructions cause the processor to calculate a distance-to-fault based on the SSTDR data. The instructions further cause the processor to compare the distance-to-fault to the length of the wire segment. The instructions also cause the processor to, in response to the distance-to-fault being less than the length of the wire segment, generate fault data indicating a failure within the wire segment. The instructions cause the processor to send the fault data to a user output device.

In some embodiments, the instructions cause the processor to generate 3-point vehicle coordinate information indicating a position of the failure based on the wiring data and on the distance-to-fault. The fault data may include the 3-point vehicle coordinate information.

Figure 1:
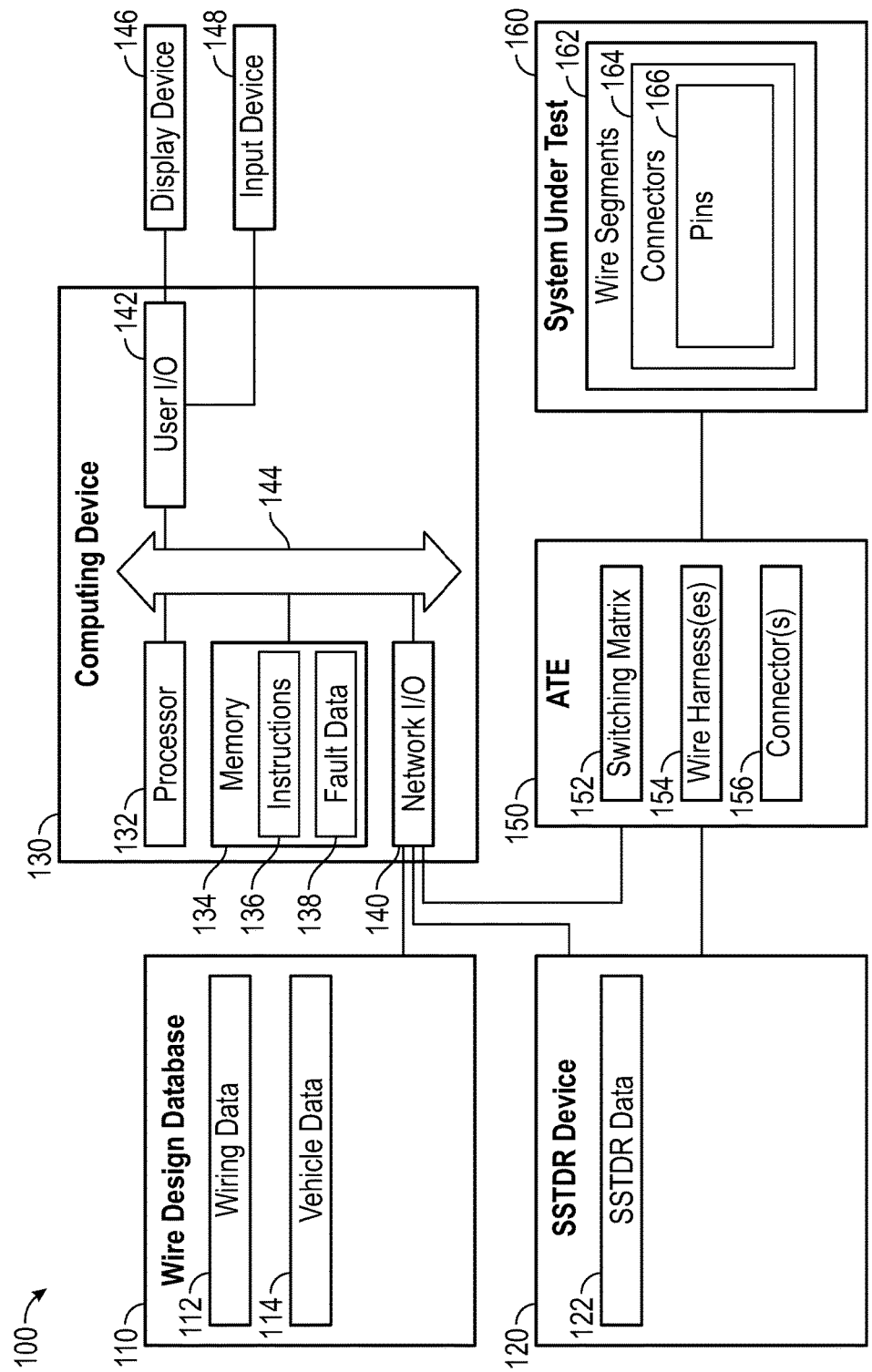
FIG. 1 depicts a block diagram of an embodiment of system for SSTDR and design data wire testing.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

DETAILED DESCRIPTION

Referring to FIG. 1, a block diagram of an embodiment of system 100 for SSTDR and design data wire testing is depicted. The system 100 may include a design database 110, an SSTDR device 120, a computing device 130, and automated testing equipment 150. The system 100 may be coupled to a system-under-test 160 via the automated testing equipment 150.

The design database 110 may include wiring data 112 and vehicle data 114. The wiring data 112 may include information related to wiring within one or more electrical systems of the system-under-test 160. In an embodiment, the one or more electrical systems may relate to vehicles, such as aircraft. For each vehicle, the wiring data 112 may indicate features, such as a position of wiring paths throughout the vehicle, the types of electrical connectors along the wiring paths, the distances between the electrical connectors, materials included in the electrical connectors, the types of wires along the wiring paths, materials included in the wires, other information regarding wiring within the vehicle, or combinations thereof.

The vehicle data 114 may include information related to a 3-dimensional structure of one or more vehicles. This information may be usable to create visual depictions of the one or more vehicles. Although depicted as a single database, the design database 110 may be implemented as one or multiple databases. Further, in some embodiments, the design database 110 may omit the vehicle data 114, or the vehicle data 114 may be included as part of the wiring data 112. Also, the design database 110, or portions thereof, may be located remotely from the other elements of the system 100.

The SSTDR device 120 may include one or more systems configured to perform SSTDR testing for one or more wires. In general, SSTDR testing may include generating a pseudo-noise signal with low energy. The pseudo-noise signal may be outside an operating range of devices coupled to wires-under-test so that it does not interfere with the devices. The SSTDR device may transmit the pseudo-noise signal across the wires-under-test over a broad range or spread of frequencies. Typically, a return path is also connected to the SSTDR device to enable a reflected signal to be collected.

The SSTDR device 120 may generate SSTDR data 122 based on transmitted and reflected signals. The SSTDR data 122 may include a set of data points associated with signals and their reflections. In some embodiments, the SSTDR device 120 may determine a type of fault and/or a distance-to-fault for a wire-under-test. In these embodiments, the SSTDR data 122 may include the type of fault and/or the distance-to-fault. In some alternative embodiments, the SSTDR device 120 may generate raw data and the computing device 130 may be used to determine the type of fault and distance-to-fault.

The computing device 130 may include a processor 132, memory 134, a network input/output 140, and a user input/output 142. A bus 144 may couple the processor 132, the memory 134, the network input/output 140, and the user input/output 142 together to enable communication therebetween. Although only one bus 144 is depicted, the computing device 130 may include multiple busses or other types of communication pathways between any of its elements. The computing device 130 may further include additional hardware to facilitate the performance of communications and computations related to SSTDR and design data wire testing as desired.

The processor 132 may perform computations using a central processing unit (CPU), a graphical processing unit (GPU), a digital signal processor (DSP), a peripheral interface controller (PIC), or another type of microprocessor. It may be implemented as an integrated circuit, a field programmable gate array (FPGA), an application specific integrated circuit (ASIC), a combination of logic gate circuitry, other types of digital or analog electrical design components, or the like, or combinations thereof.

The memory 134 may include random access memory (RAM), read only memory (ROM), magnetic disk memory, optical disk memory, flash memory, another type of memory capable of storing data and processor instructions, or the like, or combinations thereof. In some embodiments, the memory 134, or portions thereof, may be located externally or remotely from the rest of the computing device 130. The memory 134 may store instructions 136. In an embodiment, the memory 134 includes a non-transitory computer readable medium (e.g., a remotely stored hard disk, a compact disc read only memory (CDROM), a digital video disc (DVD), an external memory drive, etc.) that stores instructions 136. When executed by the processor 132, the instructions 136 may cause the processor 132 to perform operations. The operations may correspond to any operations described herein for SSTDR and design data wire testing.

The memory 134 may, at times, also store fault data 138 generated by the processor 132, as described further herein. The fault data 138 may indicate whether one or more failures have been detected in the system-under-test 160. Additional data may also be stored at the memory 134 to facilitate the performance of communications and computations related to SSTDR and design data wire testing as desired.

The network input/output 140 may include one or more networking devices to enable the computing device 130 to communicate with the design database 110, the SSTDR device 120, and the automated testing equipment 150. The network input/output 140 may include wireless connections, wired connections, or both, and may communicate via wide area network (WAN), local area network (LAN), serial peer-to-peer communication, another type of wired or wireless network communication, or the like, or combinations thereof.

The user input/output 142 may include one or more user input/output interfaces to enable the computing device 130 to communicate with a user. For example, the user input/output 142 may include a keyboard interface, a video interface, a mouse interface, an audio interface, another type of user interface, or the like, or combinations thereof.

The display device 146 may enable the fault data 138 to be output to a user. As such, the display device 146 may include hardware to present information to the user. For example, the display device 146 may include a monitor, a screen, another type of visual display, or the like, or combinations thereof. In some embodiments, the display device 146 may be incorporated within the computing device 130.

The input device 148 may enable user input to be received by the computing device 130. As such, the input device 148 may include hardware to receive input. For example, the input device 148 may include a keyboard, a mouse, a touchscreen, another type of input mechanism, or the like, or combinations thereof.

The automated testing equipment 150 may include a switching matrix 152, one or more testing wire harnesses 154, and one or more electrical connectors 156 to couple the testing wire harnesses 154 to the system-under-test 160. Embodiments of the automated testing equipment 150 are further described with reference to FIG. 2.

The system-under-test 160 may be divided into a set of wire segments 162. Each wiring segment may include a set of electrical connectors 164. Each electrical connector of the set of electrical connectors 164 may include a set of pins 166. The wire segments 162 may correspond to each possible wiring path through the system-under-test 160 and the electrical connectors 164 may correspond to electrical connectors at each endpoint of the wire segments 162 and to intermediate electrical connectors along paths the wire segments 162. In some embodiments, the system-under-test 160 corresponds to an aircraft or another vehicle.

The switching matrix 152 may include a set of switched circuits to selectively connect the SSTDR device 120 to selected pins of the set of pins 166 via the one or more testing wire harnesses 154 and the electrical connectors 156. For example, a particular pin of the set of pins 166 may be selected and programmed into the switching matrix 152. Thereafter, the switching matrix 152 may connect the SSTDR device 120 to the selected pin via the one or more testing wire harnesses 154 and the one or more electrical connectors 156. Likewise, a parallel path pin may also be selected and programmed into the switching matrix 152. A parallel path pin, as used herein, means a wire that follows the same path as the originally selected pin. The SSTDR device 120 may use the parallel path pin to perform SSTDR tests on a selected wiring path. In some embodiments, the switching matrix 152 may be programmed directly by the design database 110, by the SSTDR device 120, or by another device configured to automatically test multiple wire paths of the set of wire segments 162. Connections via the automated testing equipment 150 are further described with reference to FIG. 2.

In some embodiments, the automated testing equipment 150 may further include additional equipment (not shown) to test various additional characteristics of the system-under-test. For example, the automated testing equipment 150 may include one or more ohmmeters, one or more ammeters, one or more other electrical characteristic measurement devices, or the like, or combinations thereof. Further, in some embodiments, the automated testing equipment 150 may be omitted from the system 100. In these embodiments, the SSTDR device 120 may be manually connected directly to selected pins of the set of pins 166 for testing.

During operation, a user may instruct the processor 132, via the input device 148 to perform a test on a particular wire segment of the set of wire segments 162. In some embodiments, the particular wire segment may be identified based on user input indicating a first connector, a pin of the first connector, and a second connector, as described further herein. Alternatively, the particular wire segment may be automatically selected as part of a programmed test.

After selection of the particular wire segment, the processor 132 may initiate retrieving at least a portion of the wiring data 112 corresponding to the wire segment from the design database 110 via the network input/output 140. In order to perform SSTDR testing on the wire segment, a parallel wire, running along the same wiring path as the selected wire, may be selected as a return path. The processor 132 may also initiate retrieving additional wiring data indicating one or more additional wire segments that follow a same path as the particular wire segment. In some embodiments, a user may select a particular parallel wire segment to use as the return path. In other embodiments, the processor 132 may automatically select the parallel wire segment.

After selection of the wire segment and the parallel wire segment, the processor 132 may send instructions to the SSTDR device 120 to generate the SSTDR data 122 associated with the wire segment. In order for the SSTDR device 120 to generate the SSTDR data 122, the switching matrix 152 may be programmed to connect the SSTDR device 120 to a particular pin of the set of pins 166 that is associated with the particular wire segment. The switching matrix 152 may further connect the SSTDR device 120 to a parallel pin of the set of pins 166 associated with the parallel wire segment. Alternatively, in some embodiments, the SSTDR device 120 may be manually coupled directly to the particular pin and the parallel pin, without using the switching matrix 152.

The SSTDR device 120 may perform SSTDR tests on the wire segment to generate the SSTDR data 122. In some embodiments, multiple SSTDR tests may be performed by connecting the SSTDR device 120 to additional connectors of the set of electrical connectors 164 and between additional pins of the set of pins 166. In these embodiments, the switching matrix 152 may be automatically set to iterate through each of the pins 166 of a selected electrical connector of the set of electrical connectors 164. In that way, the system 100 may test an entire wire harness of a vehicle at a same time without further user intervention.

In some cases, the SSTDR data 122 may be indicative of a failure in a wire segment of the set of wire segments 162. For example, analysis of the SSTDR data 122 may show a discontinuity within a wire segment. A distance-to-fault may be calculated and included as part of the SSTDR data 122. The distance-to-fault may represent a distance from the SSTDR device to the discontinuity. In some embodiments, the distance-to-fault may represent a distance from the beginning of a wire segment to the discontinuity, not including any intermediate pathways (e.g., through the automated testing equipment). The distance-to-fault may be included in the SSTDR data 122. Alternatively, in some embodiments, the SSTDR data 122 may include raw data and the distance-to-fault may be calculated by the processor 132 based on the SSTDR data 122.

The SSTDR data 122, along with the distance-to-fault, may be combined with the wiring data 112 to determine whether a failure exists within the tested wire segment. For example, the distance-to-fault may be compared to a length of the wire segment. When the distance-to-fault is less than the length of the wire segment, the fault data 138 may indicate a failure within the wire segment. In embodiments that use the automated testing equipment 150, the fault data 138 may indicate a failure when the distance-to-fault is greater than a length of a connection through the automated testing equipment 150 but less than a combined length of the connection through the automated testing equipment 150 and of the wire segment. After a determination that a failure has occurred, a position of the failure, as determined by the distance-to-fault, may be stored in the fault data 138 and sent to the display device 146.

In some embodiments, a position of the failure with a vehicle may be calculated. For example, the processor 132 may retrieve additional wiring data indicating a position of a pathway of the wire segment through a vehicle. In some embodiments, the additional wiring data may be includes as part of the vehicle data 114. Based on this additional wiring data, 3-point vehicle coordinates may be calculated indicating to a technician a precise location of the failure within the vehicle. These 3-point vehicle coordinates may be included within the fault data 138. As described further herein, the fault data 138 may take many forms and may include various visualizations, including 3-dimensional visualizations, to enable a user to locate the failure.

In some embodiments, the fault data 138 may indicate a type of failure. The type of failure may be determined based on the SSTDR data 122. For example, analysis of the data may indicate whether the failure is due to an open circuit or a shorted circuit. In some embodiments, the processor 132 may initiate retrieving additional wiring data indicating at least one material of the wire segment. Known electrical properties of the material may be compared to electrical properties determined based on the SSTDR data to determine whether a failure is due to a damaged circuit, even if the circuit is not completely open or shorted.

Because the SSTDR device 120 alone has limited information regarding the structure of the system-under-test 160, the SSTDR data 122 may not include any indication of where a tested wiring path is located within the system-under-test 160. As such, the SSTDR data 122 alone may be insufficient to quickly locate a failure within a wire segment. A benefit of the system 100 is that by combining the SSTDR data 122 with the wiring data 112, the computing device 130 may generate the fault data 138 showing a position of a failure within the system-under-test 160. By further combining the vehicle data 114, the fault data 138 may depict the position via a user-friendly three-dimensional image. The fault data 138 may then be presented to a user via the display device 146. This may enable a technician to quickly pinpoint a failure within a wire segment, resulting in faster wire testing as compared to systems that rely on SSTDR data alone and systems that rely on connectivity tests (e.g., using ohmmeters, ammeters, digital multi-meters, etc., to test circuit connectivity) alone. Other benefits and advantages of the system 100 may also exist.

Figure 2:
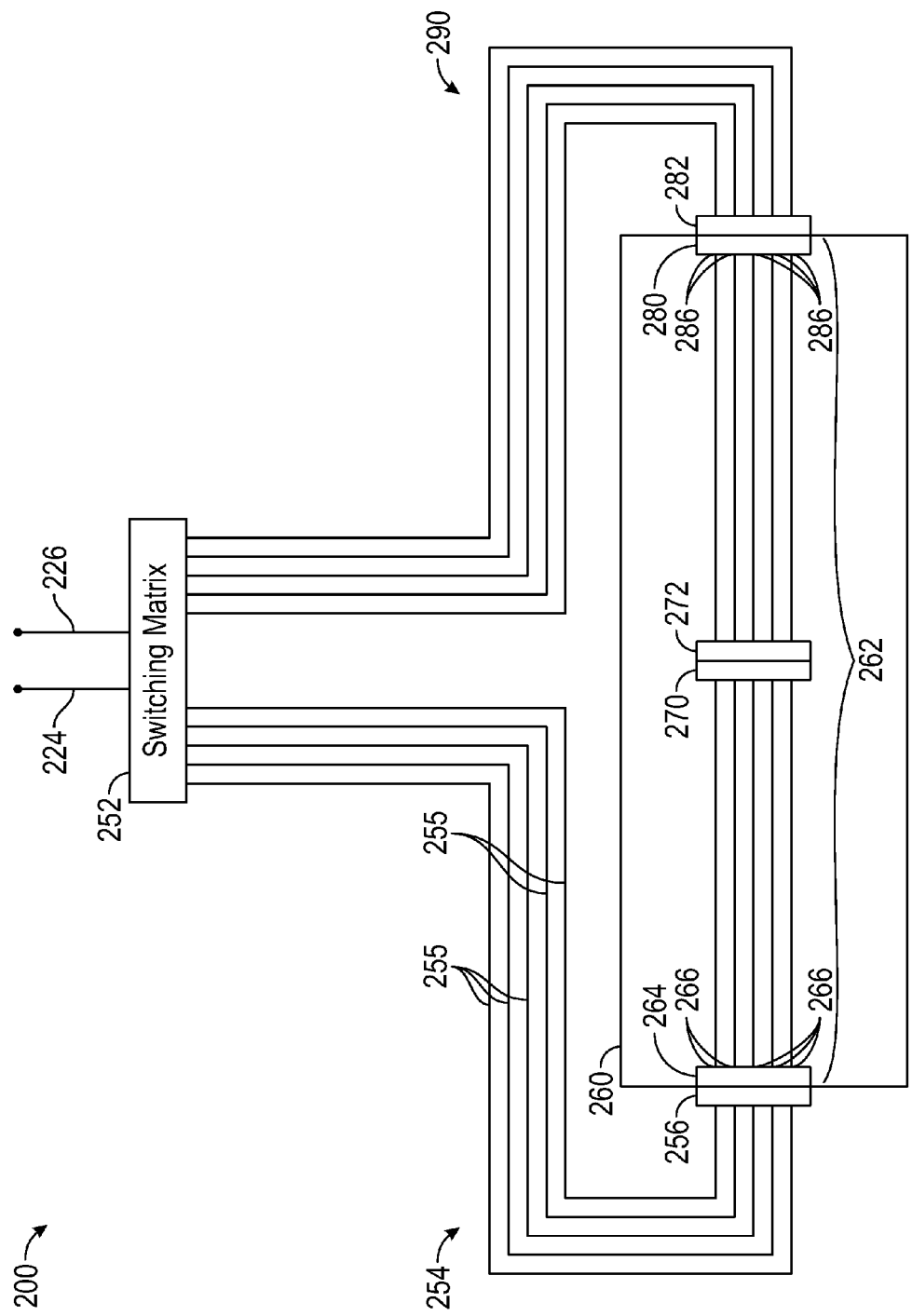
FIG. 2 depicts an embodiment of automated testing equipment for use with SSTDR and design data wire testing.

Referring to FIG. 2, an embodiment of automated testing equipment 200 for use with SSTDR and design data wire testing is depicted. The automated testing equipment 200 may include a switching matrix 252, a first testing wire harness 254, a second testing wire harness 290, a first electrical connector 256, and a second electrical connector 282. The automated testing equipment 200 may be configured to connect to a system-under-test 260. A first terminal 224 may be configured to couple a testing path probe of an SSTDR device to the automated testing equipment 200 and a second terminal 226 may be configured to couple a parallel path probe of the SSTDR device to the automated testing equipment 200. The automated testing equipment 200 may correspond to the automated testing equipment 150, and the determinations and calculations described with reference to FIG. 2 may be performed by the computing device 130.

The system-under-test 260 may include multiple parallel wire segments 262. The multiple parallel wire segment 262 may include a first electrical connector 264 at a first end of the multiple parallel wire segment 262, a second electrical connector 280 at a second end of the multiple parallel wire segment 262, and intermediate electrical connectors 270, 272. The first electrical connector 264 at the first end of the multiple parallel wire segments 262 may include multiple pins 266. Each of the pins 266 may correspond to a respective wire segment of the multiple parallel wire segments 262. Likewise, the second electrical connector 280 may include multiple pins 286 with each of the pins 286 corresponding to respective wire segments of the multiple parallel wire segments 262.

The first testing wire harness 254 may include multiple wires 255 configured to connect to the system-under-test 260 via the first electrical connector 264 at the first end of the multiple parallel wire segments 262. Likewise, the second testing wire harness 290 may be configured to connect to the system-under-test 260 via the second electrical connector 280 at the second end of the multiple parallel wire segments 262. By connecting at both ends of the multiple parallel wire segments 262, the switching matrix 252 may connect an SSTDR device coupled to the terminals 224, 226, to either end of the multiple parallel wire segments 262. This may enable SSTDR data to be generated for a particular wire segment from either end of the wire segment.

During operation, the switching matrix 252 may iteratively couple the SSTDR device to each of the pins 266 via the first terminal 224 and via the first testing wire harness 254 and perform an SSTDR test of each of the multiple parallel wire segments 262. For each of the multiple parallel wire segments 262, a distance-to-fault may be calculated. When the distance-to-fault is less than a length of a connection between the first terminal 224 and the firs electrical connector 264 through the first testing wire harness 254, then a determination that a failure has occurred somewhere within the automated testing equipment 200 may be made. SSTDR data generated as a result of one or more of the SSTDR test may be used to determine whether the failure occurred within the switching matrix 252, within the first testing wire harness 254, within the first connector 256, or within another portion of the automated testing equipment 200. As a result, a technician may be alerted to an equipment failure within the automated testing equipment 200.

When the distance-to-fault is greater than a connection length between the first terminal 224 and the first electrical connector 264 through the first testing wire harness 254, but is less than the sum of the length through the first testing wire harness 254 and the length of the multiple parallel wire segments 262, a determination that a failure has occurred within the particular wire under test of the wire segments 262 may be made. As stated herein, each of the multiple parallel wires segments 262 may be iteratively tested via the switching matrix 252. Distance-to-faults associated with each of the multiple parallel wire segments 262 may be compared to lengths respective wire segments to gain a full picture of failure positions within the multiple parallel wire segments 262.

By comparing the positions of failures within the multiple parallel wire segments 262 to positions of connectors (e.g., the first electrical connector 264, the second electrical connector 280, or the intermediate electrical connectors 270, 272) it may be determined whether an entire electrical connector is disconnected. For example, if failures occur in each of the multiple parallel wire segments 262 at a position of the intermediate electrical connector 270, then the intermediate electrical connector 270 may be disconnected from the intermediate electrical connector 272. On the other hand, if some, but fewer than each, of the multiple parallel wire segments 262 include a failure at a position of the intermediate electrical connector 270, then one or more pins of the intermediate electrical connector 270 may be recessed, damaged, or swapped. Fault data may be generated regarding these connections for output to a user.

When the distance-to-fault is greater than the sum of the length of the pathway through the automated testing equipment 200 through the first testing wire harness 254 and the length of the multiple parallel wire segments 262, then it may be determined that the failure occurred within the second testing wire harness 290. In that case, the switching matrix may reverse the testing path by coupling the SSTDR device to individual testing wires of the second testing wire harness 290 to determine a location of the failure. For example, additional SSTDR data may be generated via the second testing wire harness 290, additional distance-to-faults may be calculated, and it may be determined whether a failure occurred within the switching matrix 252, within the second testing wire harness 290, within the second electrical connector 282, or within another portion of the automated testing equipment 200. This data may be sent to a technician for troubleshooting purposes.

Figure 3:
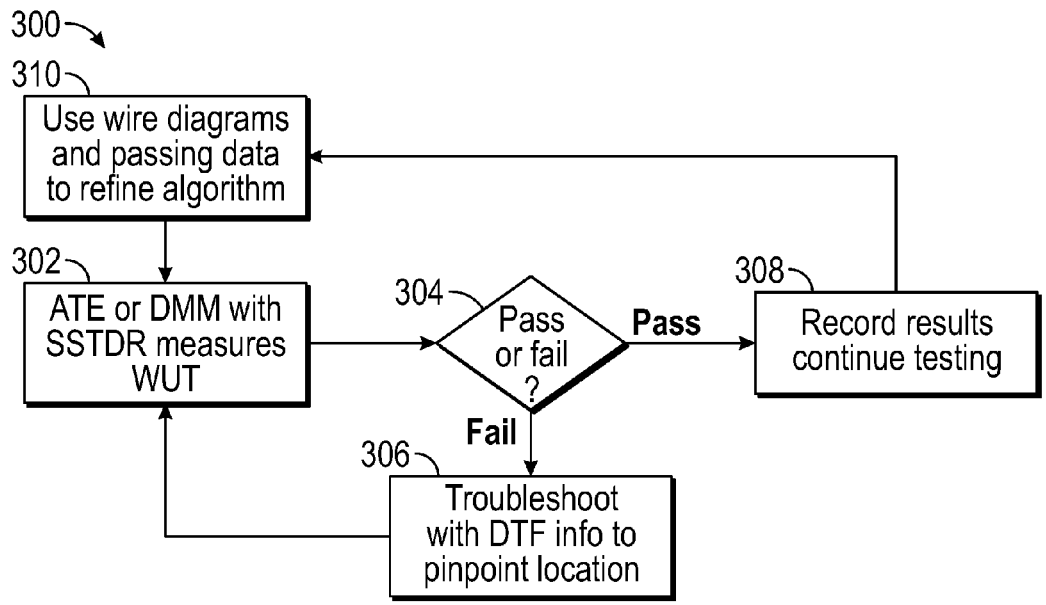
FIG. 3 depicts a flow chart of an embodiment of a method for SSTDR and design data wire testing.

Referring to FIG. 3, a flow chart of an embodiment of a method 300 of SSTDR and design data wire testing is depicted. The method 300 may include using automated testing equipment or a digital multi-meter as well as an SSTDR device to measure a wire-under-test, at 302. For example, the SSTDR device 120 may be used along with the automated testing equipment 150 or a digital multi-meter to determine whether a connectivity problem exists and a distance-to-fault of the problem if it exists.

The method 300 may further include determining whether the wire-under-test has passed or failed, at 304. For example, the processor 132 may determine whether a connectivity problem exists based on the SSTDR data 122 received from the SSTDR device 120.

The method 300 may include, when the wire-under-test has failed, using a distance-to-fault generated based on SSTDR data to troubleshoot the wire after pinpointing a location of the fault, at 306. For example, the SSTDR data 122 and the wiring data 112 may be used to pinpoint a position of the fault, which may then be corrected by a technician. The method may then include re-taking the measurements, at 302.

The method 300 may also include, when the wire-under-test has passed, recording the results and continuing with testing additional wires, at 308. For example, the processor 132 may instruct the switching matrix 152 to connect the SSTDR device 120 to another pin of the set of pins 166 or to another electrical connector of the set of electrical connectors 164.

The method 300 may further include using wire diagrams and passing data to refine the testing, at 310. For example, the wiring data 112 along with the determination that a selected wire under test has passed may be used to determine a next pin or a next electrical connector of the set of electrical connectors 164 to be tested. To illustrate, if a particular pin passes, that information may be used to refine a testing algorithm by testing other pins associated with different wiring paths.

A benefit of the method 300 is that by including SSTDR data and wire diagrams, a pinpoint location of a failure within a wire-under-test may be found and further connectivity testing to locate the failure may not be necessary. Other benefits and advantages of the method 300 may also exist.

Figure 4:
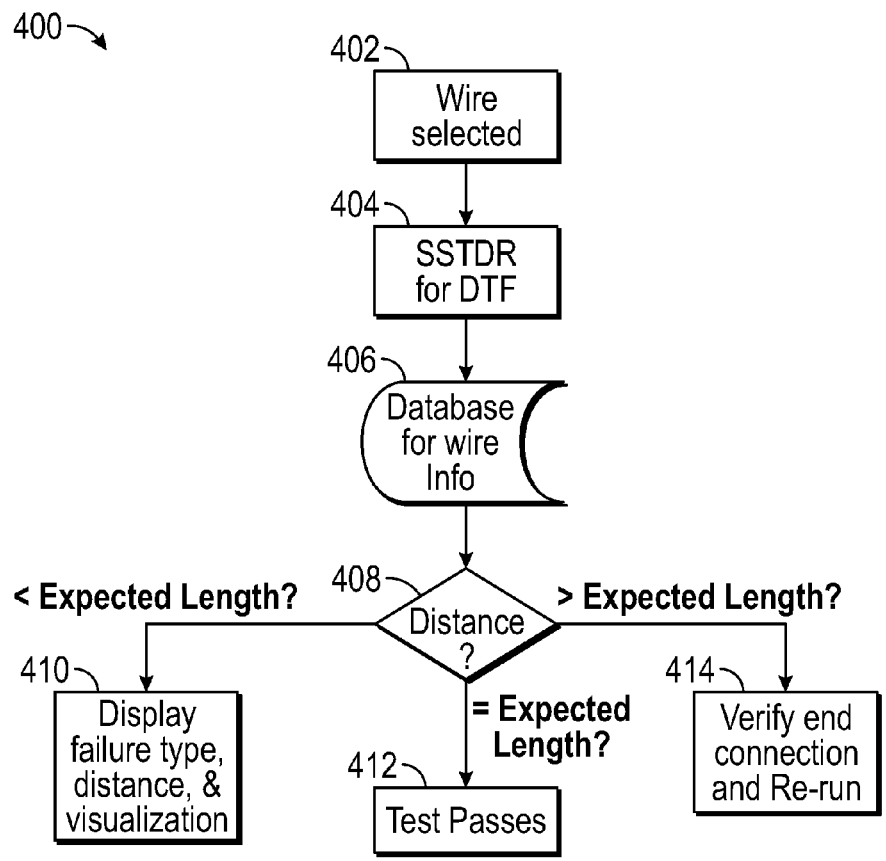
FIG. 4 depicts a flow chart of an embodiment of a method for manual SSTDR and design data wire testing.

Referring to FIG. 4, a flow chart of an embodiment of a method 400 of SSTDR and design data wire testing is depicted. The method 400 may be employed during testing of a particular set of wire segments (e.g., a wire harness) of a vehicle.

The method 400 may include selecting a wire, at 402. In some cases, the wire may be manually selected. For example, a user may select the wire by physically connecting an SSTDR system to a pin of an electrical connector associated with the wire. Alternatively, a user may select the wire by selecting a pin via a user interface of a computing device. The computing device may then communicate instructions to a switching matrix to couple the SSTDR system to the selected pin. To illustrate, a user may use the input device 148 to select an electrical connector of the set of electrical connectors 164 associated with a wire segment of the set of wire segments 162. The user may also use the input device 148 to select a pin of the set of pins 166 of the selected electrical connector. In order to perform SSTDR testing, a parallel pin may also be selected. The parallel pin may correspond to a different wire that runs along the same wiring path as the selected wire. The processor 132 may receive the user selection of the pin and the parallel pin and process the selection by sending instructions to the switching matrix 152 via the network input/output 140 to connect the SSTDR device 120 to the pin and the parallel pin for SSTDR testing.

The method 400 may further include instructing an SSTDR system to generate SSTDR data including a distance-to-fault, at 404. For example, the processor 132 may instruct the SSTDR device 120 to generate the SSTDR data 122. The SSTDR data 122 may be sent from the SSTDR device 120 to the processor 132 and may be temporarily stored at the memory 134.

The method 400 may also include querying a database to collect information regarding wiring, at 406. For example, the database may be queried to collect information regarding wire lengths of one or more wire segments, types of electrical connectors associated with the wire segments, and positions of electrical connectors. To illustrate, the processor 132 may query the design database 110 to retrieve the wiring data 112.

The method 400 may include comparing the distance-to-fault with an expected distance, at 408. The expected distance may be determined based on the wiring data 112. For example, the expected distance may correspond to a length of a wire segment under test in cases where an SSTDR device is coupled directly to the wire segment under test. In cases where automated testing equipment is used, the expected distance may correspond to the sum of a length of a pathway through the automated testing equipment and the length of the wire segment under test.

The method 400 may include, in response to the distance-to-fault being less than the expected length, displaying a failure type, a failure distance, a failure visualization, other information associated with a failure, or combinations thereof, at 410. For example, in response to the distance-to-fault be in less than a length of the wire segment under test, the fault data 138 may indicate the distance-to-fault. The fault data 138 may further include a failure type, a failure distance, and one or more visualizations associated with a failure. To determine the failure type, additional information may be retrieved from the wiring data 112, such as materials that each of the wires are made of. Based on the materials and based on the SSTDR data, the processor 132 may determine whether the fault corresponds to an open circuit, a short circuit, or a damaged circuit. Also, the distance-to-fault may be used to identifying a connector within the wire segment under test by comparing the distance-to-fault to a position of the connector recorded in the wiring data 112. The fault data 138 may be displayed at the display device 146.

The method 400 may further include, in response to the distance-to-fault being equal to the expected length, determining that the connectivity testing has passed, at 412. For example, the processor 132 may send an indication that the test has passed to the display device 146.

The method 400 may also include, in response to the distance-to-fault being greater than the expected length, verifying a connector at the end of the wiring path and re-performing the method 400 after correcting any errors, at 414. For example, electrical connectors of the set of electrical connectors 164 that are coupled to the SSTDR device 120 may be verified to ensure they are properly connected/disconnected as required by the particular test being run.

If a switch matrix is used as part of the method 400, the method may be repeated for additional pins. The test results may be compiled to determine if an entire electrical connector is missing (all paths associated with a connector are open) or if a particular pin of a connector is recessed, damaged, swapped with another pin, or is otherwise disabled.

A benefit of the method 400 is that by using both the wiring data and SSTDR data, a position of a fault within a wiring path may be accurately determined without performing lengthy iterative tests to narrow-in on the fault. Other benefits and advantages of the method 400 may also exist.

Figure 5:
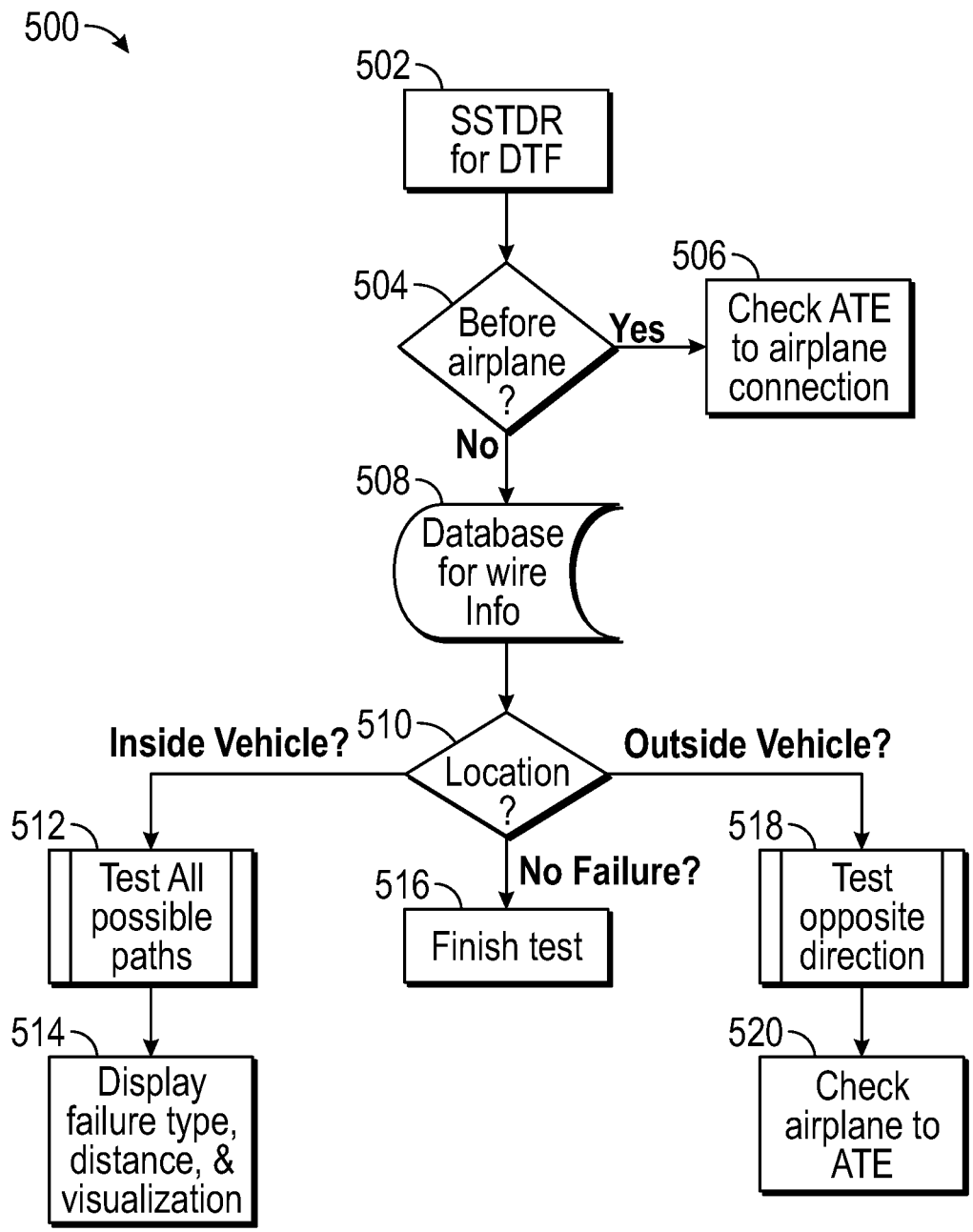
FIG. 5 depicts a flow chart of an embodiment of a method for automatic SSTDR and design data wire testing.

Referring to FIG. 5, a flow chart of an embodiment of a method 500 of SSTDR and design data wire testing is depicted. The method 500 may be employed during automatic testing of multiple wire paths or multiple connectors associated with a wire path of a vehicle. In this embodiment, the vehicle may be coupled to an SSTDR system via automatic testing equipment that enables the SSTDR system to perform tests using multiple pins associated with electrical systems of the vehicle.

The method 500 may include performing an SSTDR test on a wire segment to determine a distance-to-fault, as described herein, at 502. To illustrate, the SSTDR device 120 may perform SSTDR testing on one of the multiple parallel wire segments 262. The switching matrix 252 may couple the SSTDR device 120 to the wire segment via the electrical connectors 256, 264.

The method 500 may further include determining whether the distance-to-fault occurs before a connection to the vehicle (e.g., within an electrical harness of the automatic testing equipment), at 504. For example, the distance-to-fault may be compared to a length of an electrical pathway through the automated testing equipment.

The method 500 may further include, in response to the distance-to-fault occurring before the connection to the vehicle, checking a connection between the automatic testing equipment and the vehicle. Further, based on the distance-to-fault, a possible location of a failure within the testing equipment may be determined. For example, it may be determined whether the fault occurred within a switching matrix, within a testing wire harness, or within an electrical connector of the automated testing equipment. To illustrate, the failure may be due to the first electrical connector 256 being unconnected. In other cases, the first testing wire harness 254 or the switching matrix 252 may have become damaged.

The method 500 may also include, in response to the distance-to-fault occurring after the connection to the vehicle, querying a database to retrieve information regarding a wire segment under test, at 508. The information may include a length of the wire segment, connectors used in association with the wire segment, a material used within the wire segment, or combinations thereof.

The method 500 may include determining a location of a discontinuity, at 510. For example, if the distance-to-fault is greater than the length of the electrical path through the automated testing equipment, but less than the combined lengths of the electrical path through the automated testing equipment and the length of the wire segment under test, then the location may be determined to be inside the vehicle. If the distance-to-fault is equal to the combined lengths of the electrical path through the automated testing equipment and the length of the wire segment under test, then it may be determined that no failure has occurred. If the distance-to-fault is greater than the combined lengths of the electrical path through the automated testing equipment and the length of the wire segment under test, then the location may be determined to be outside the vehicle, potentially falling within testing equipment coupled to an opposite end of the wire segment.

The method 500 may include, in response to the location of the failure occurring within the vehicle, testing all possible paths through a wiring harness, at 512. To illustrate, each wire segment of the set of multiple parallel wire segments 262 may be iteratively tested.

After, the possible paths through the wiring harness are tested, the method 500 may include displaying a failure type, distance, and visualization of the failure, at 514. To illustrate, the fault data 138 may include a failure type, distance, and visualization that may be presented at the display device 146.

The method 500 may include, in response to determining that no fault has occurred, finishing the test, at 516. To illustrate, an indication may be sent to the display device 146 that the wire segment under test has passed. Further tests may or may not be performed.

The method 500 may include, in response to the location of the failure occurring outside the vehicle, using additional automated testing equipment coupled to an opposite end of the wire segment under test to perform SSTDR testing in an opposite direction, at 518. Based on the additional SSTDR testing, it may be determined whether the failure has occurred in a switching matrix, a testing wire harness, or an electrical connector of the additional automated testing equipment. To illustrate, the switching matrix 252 may couple the SSTDR device 120 to the wire segments under test via the electrical connectors 280, 282. SSTDR testing may then be performed from the new direction.

After testing the wire segment under test from the opposite direction, the method 500 may include checking connections between the vehicle and the automated testing equipment, at 520.

A benefit of the method 500 is that errors or damage with automated testing equipment may be assessed as SSTDR testing within wire segments occurs. Other benefits and advantages of the method 500 may also exist.

Figure 6:
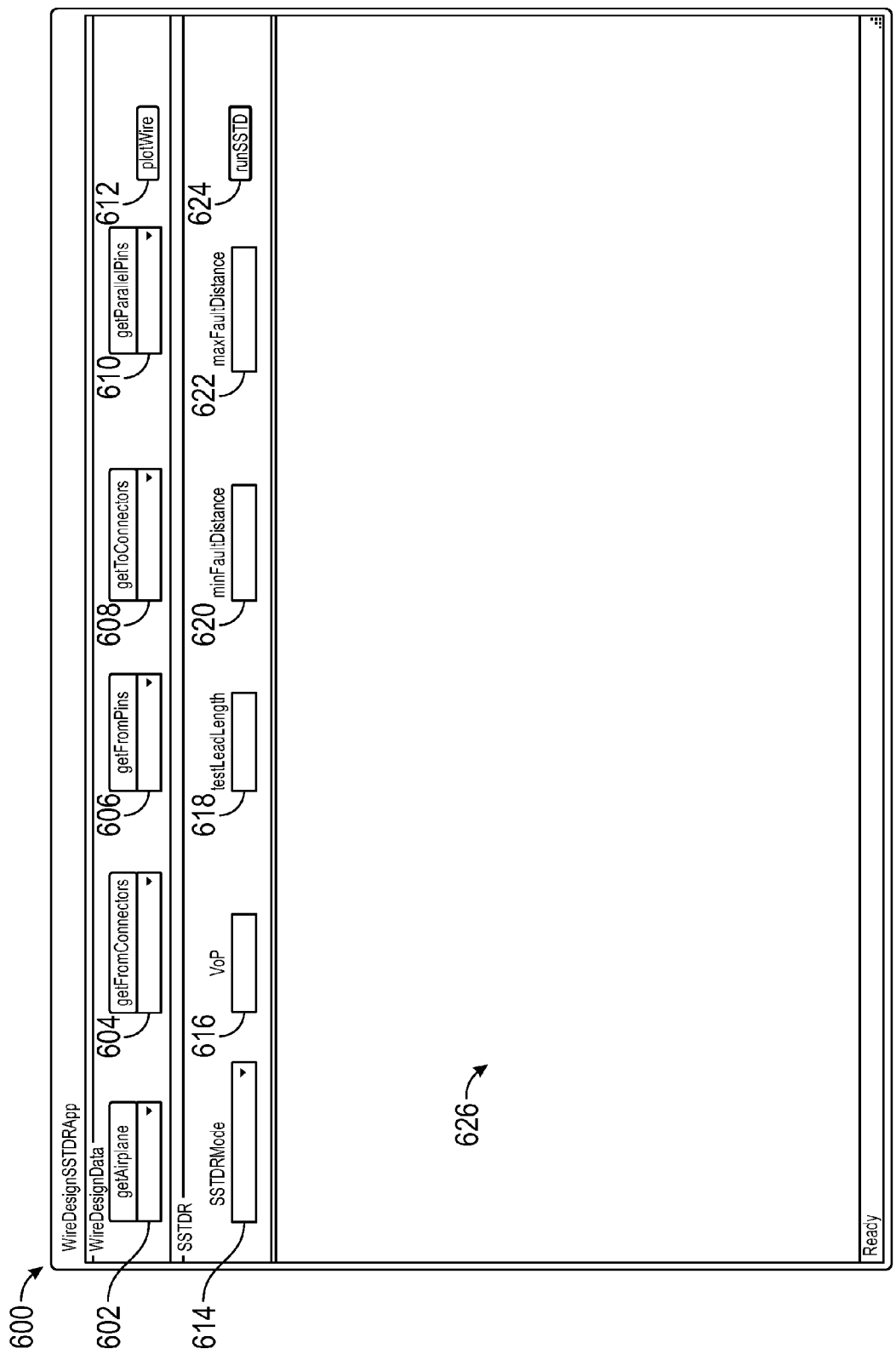
FIG. 6 depicts an embodiment of a graphical user interface (GUI) usable for SSTDR and design data wire testing.

Referring to FIG. 6, an embodiment of a graphical user interface (GUI) 600 usable for SSTDR and design data wire testing is depicted. The GUI 600 may be generated by the processor 132. The GUI may be displayed to a user via the display device 146 and input may be received via the input device 148.

The GUI 600 may include wire design data inputs including a vehicle selection input 602, a first connector selection input 604, a pin selection input 606, a second connector selection input 608, a parallel pin selection input 610, and a plot wire button input 612. Selection data for the wire design data inputs may be auto-populated based on preceding selections. For example, based on a vehicle selection using the vehicle selection input 602, the wiring data 112 may be queried to generate a list of connectors associated with the selected vehicle. The list of connectors may be listed as options within the first connector selection input 604. Likewise, pins associated with a selected connector may be listed as options within the pin selection input 606. Options for the second connector selection input 608 may include connectors that are coupled to a selected pin.

After a particular wire segment is selected via the selection inputs 602-608, a list of different pins connected to parallel wire segments may be used to populate the parallel pin selection input 610. Once a user has made all the selections regarding wire design data, the plot wire button input 612 may be selected to plot data regarding the wire segment. Visualization regarding the plotting of wire data are further described herein.

The GUI 600 may also include SSTDR inputs including an SSTDR mode selector input 614, a velocity of propagation input 616, a test lead length input 618, a minimum fault distance input 620, a max fault distance input 622, and a run SSTDR button input 624. The GUI 600 may also include a display area 626 for displaying results.

The SSTDR mode selector input 614 may include options for a single channel mode and a multi-channel mode. The single channel mode may be used to test a single wire segment. The multi-channel mode may be used in conjunction with the switching matrix 152 to test all parallel paths (e.g., within a wire harness) without additional user intervention, as described herein.

A velocity of propagation may be entered via the velocity of propagation input 616. This information may be used in analyzing the SSTDR data to determine a distance-to-fault. Further, a distance within the automated testing equipment 150 from the SSTDR device 120 to the system-under-test 160 may be input via the test lead length input 618. As described herein, the distance within the automated testing equipment may help in determining the exact position of a failure within the system-under-test 160. Also, a maximum and minimum fault distance may be input to create a test envelop, thereby limiting the scope of testing to an area of interest. Once a user has made all the selections regarding SSTDR settings, the run SSTDR button input 624 may be selected to plot data regarding SSTDR testing on the wire segment, thereby generating the SSTDR data 122. Visualization regarding the SSTDR data 122 and combinations of the SSTDR data 122 with the wiring data 112 and the vehicle data 114 are further described herein.

Figure 7:
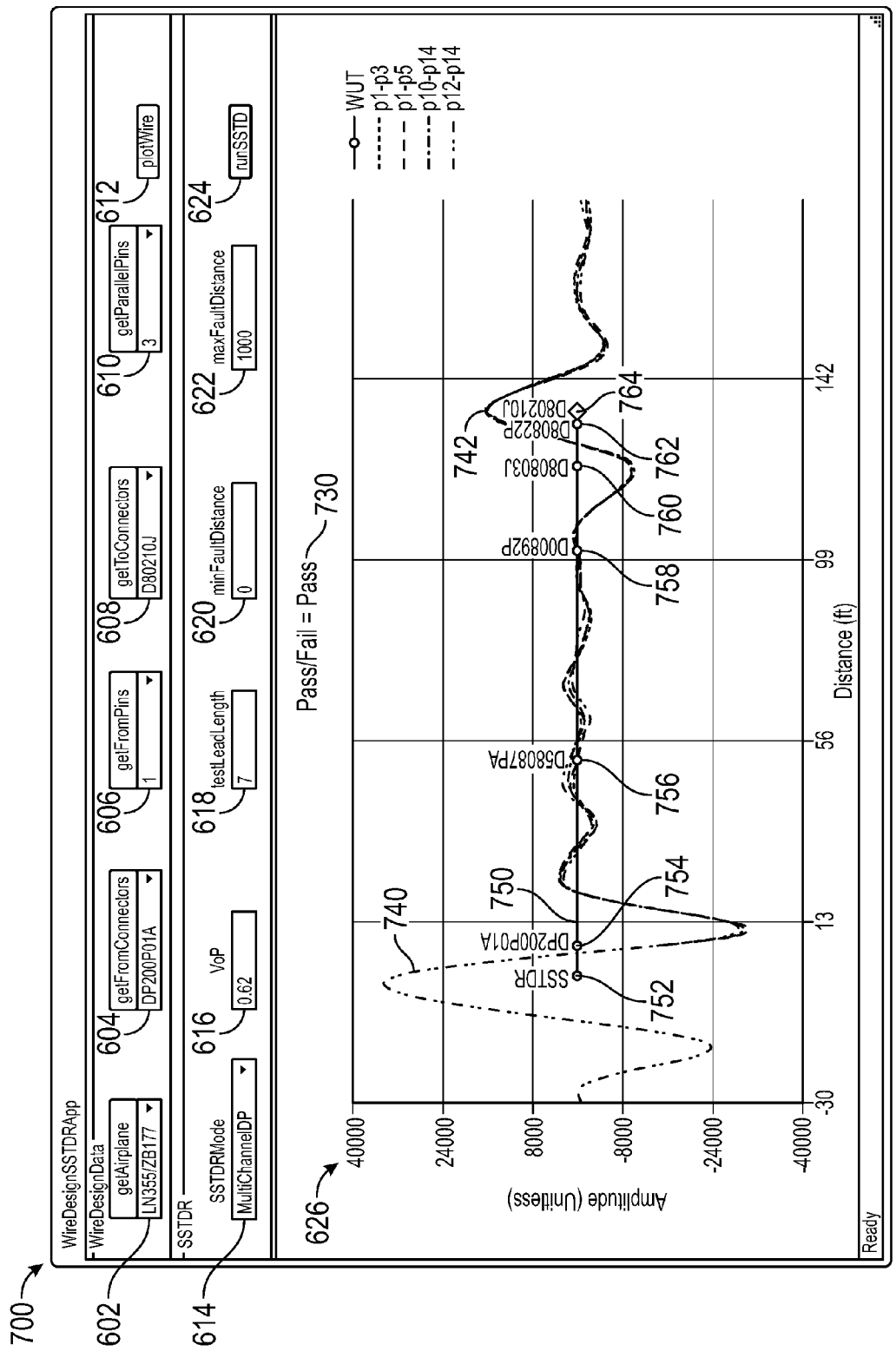
FIG. 7 depicts an embodiment of a GUI usable for SSTDR and design data wire testing including visualizations of SSTDR data and wiring data.

Referring to FIG. 7, an embodiment of a GUI 700 usable for SSTDR and design data wire testing is depicted. In response to selection of the plot wire button input 612, a visualization 750 of a wire under test may be generated. The visualization 750 may include a depiction 752 of the SSTDR device. The visualization 750 may further include depictions of each connector associated with the wire under test. In the example shown in FIG. 7, the visualization 750 includes a depiction 754 of a first connector, a depiction 756 of a second connector, a depiction 758 of a third connector, a depiction 760 of a fourth connector, a depiction 762 of a fourth connector, and a depiction 764 of a fifth connector. The depictions 752-764 may be spaced according to distances retrieved from the wiring data 112.

In response to selection of the run SSTDR button input 624, a visualization 740 of SSTDR data may generated and superimposed over the visualization 750 of the wire under test. As depicted in FIG. 7, when in multichannel mode, the visualization 740 of the SSTDR data may include multiple lines corresponding to multiple pins between connectors. Amplitudes based on the reflectometry information may be analyzed to indicate discontinuities within the wires under test. In the example depicted in FIG. 7, a peak amplitude 742 is depicted at a location of the fifth connector, shown in the GUI as depiction 764. In this case, the distance between the SSTDR device, shown in the GUI as depiction 752, and the peak amplitude 742 is equal to the distance between the SSTDR device and the fifth connector. As described herein, the distance between the SSTDR device and the fifth connector is made up of a length of a path through automated testing equipment (from the SSTDR device to the first connector, shown in the GUI as depiction 754, which is input as 7 meters in the test lead length input 618) and a length of the wire segment under test (from the first connector to the fifth connector).

Because the distance between the SSTDR device and the discontinuity shown by the peak amplitude 742 equals a sum of the length of the automated testing equipment and the length of the wire segment under test, the wire segment has passed the test. An indication 730 that the test has passed may be included within the display area 626.

Figure 8:
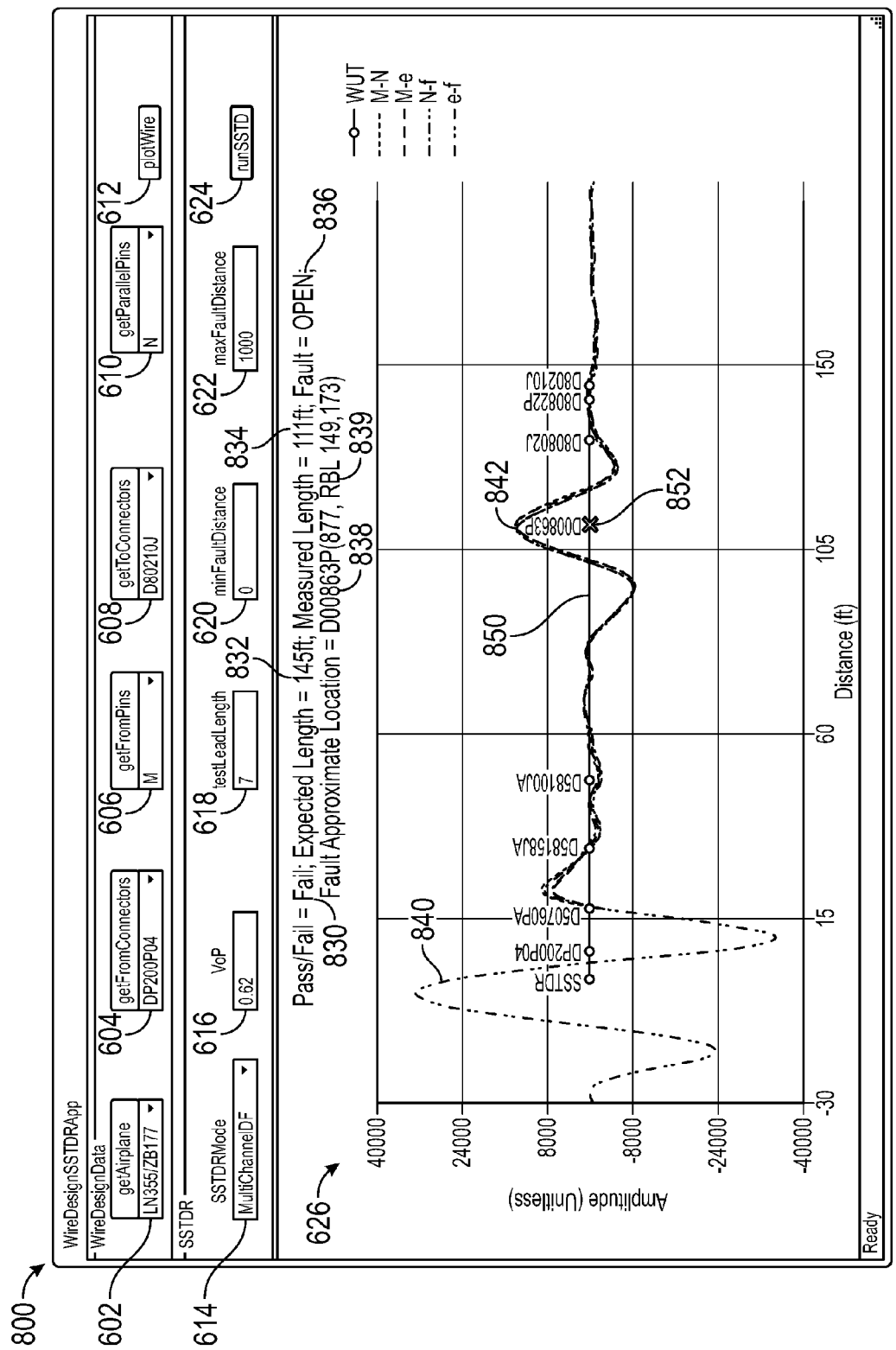
FIG. 8 depicts an embodiment of a GUI usable for SSTDR and design data wire testing including visualizations of SSTDR data and wiring data.

Referring to FIG. 8, an embodiment of a GUI 800 usable for SSTDR and design data wire testing is depicted. The GUI 800 may be generated in response to determining that a failure has occurred within a wire segment under test. For example, a visualization 840 of SSTDR data may depict a peak amplitude 842. A visualization 850 of wire data may show an intermediate connector 852 at the same distance from the SSTDR device. Because the distance to the discontinuity is less than the sum of the length of a path through automated testing equipment and a length of the wire segment under test, the display area 626 may include an indication 830 that a failure has occurred. The display area 626 may further include an expected length 832 (the sum of the length of a path through automated testing equipment and a length of the wire segment under test). An indication 834 of a measured length may indicate a distance-to-fault as determined by the peak amplitude 842. A type of failure may be determined as described herein and may be depicted via indicator 836.

Further, a location of the failure may be shown. The location of the failure may include a first portion 838 indicating a connector associated with the failure and a second portion 839 indicating a three-point vehicle position of the failure. The three-point vehicle position may be calculated based on the vehicle data 114.

A benefit of the GUI 800 is that by combining the visualization 840 of the SSTDR data with the visualization 850 of the wiring data, the position of a failure may be depicted via a user-friendly graphical display. Further, a three-point vehicle position of the failure may be output to a user. This may enable a technician to quickly pinpoint a failure within a wire segment, resulting in faster wire testing as compared to systems that rely on SSTDR data alone and systems that rely on connectivity tests (e.g., using ohmmeters, ammeters, digital multi-meters, etc., to test circuit connectivity) alone. Other benefits and advantages of the system 100 may also exist.

Figure 9:
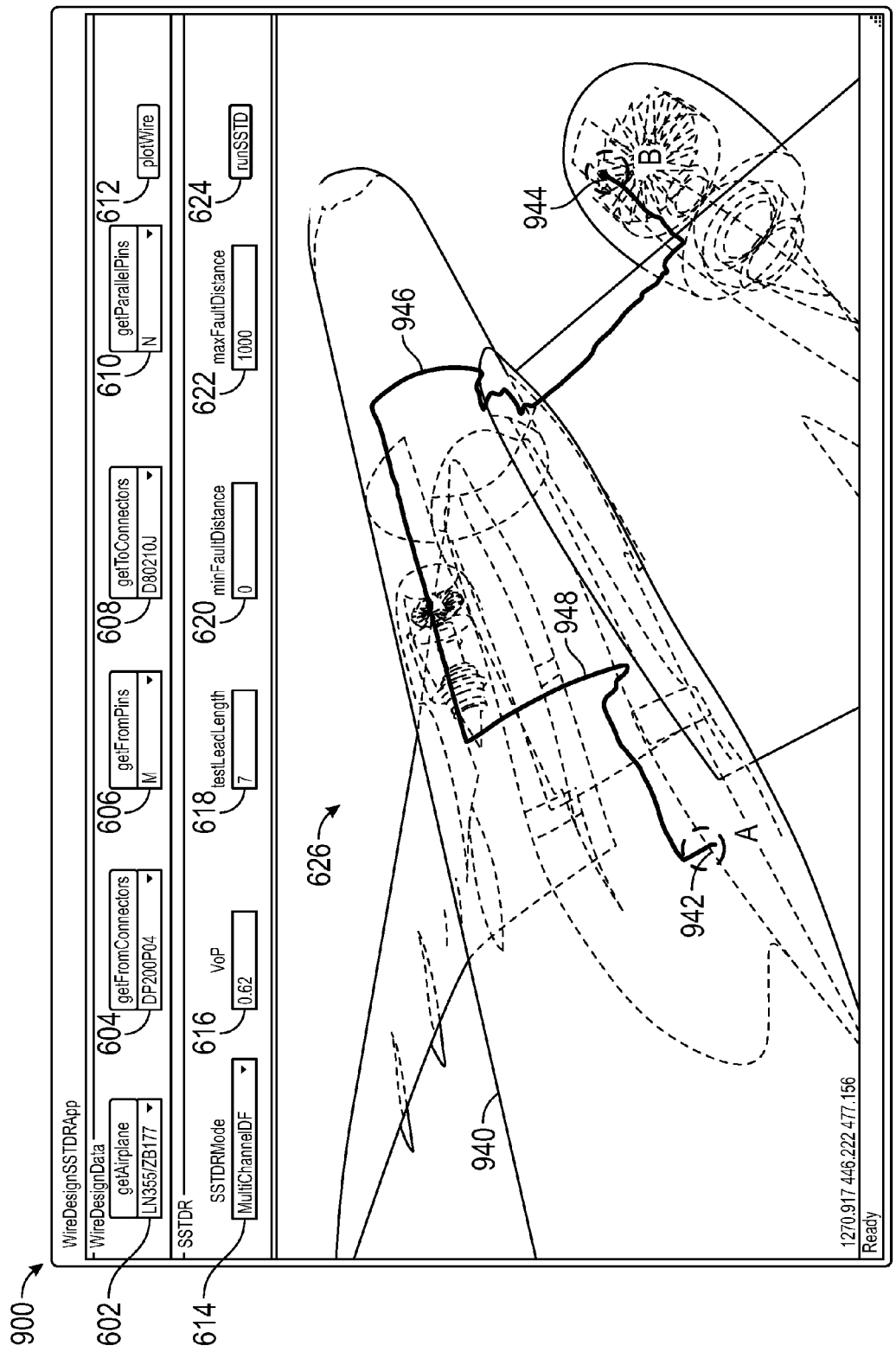
FIG. 9 depicts an embodiment of a GUI usable for SSTDR and design data wire testing including a three-dimensional representation of a vehicle.

Referring to FIG. 9, an embodiment of a GUI 900 usable for SSTDR and design data wire testing is depicted. The GUI 900 may include a three-dimensional depiction 940 of a vehicle. The three-dimension depiction may include a depiction 942 of a position of a first connector within the vehicle and a depiction 944 of a position of a second connector within the vehicle. An indication 946 of a position of a wire segment may show the path taken by the wire segment throughout the vehicle. Based on an SSTDR analysis and based on wiring data as described herein, an indication 948 of a position of a failure within the wire segment may be generated. The indication 948 may be generated based on the three-coordinate vehicle position of FIG. 8. By generating a 3-dimensional visualization of the vehicle and indicating a position of the failure within the vehicle based on the 3-dimensional visualization information the GUI 900 may further simplify the process of locating a failure of a wire segment within a vehicle.

Figure 10:
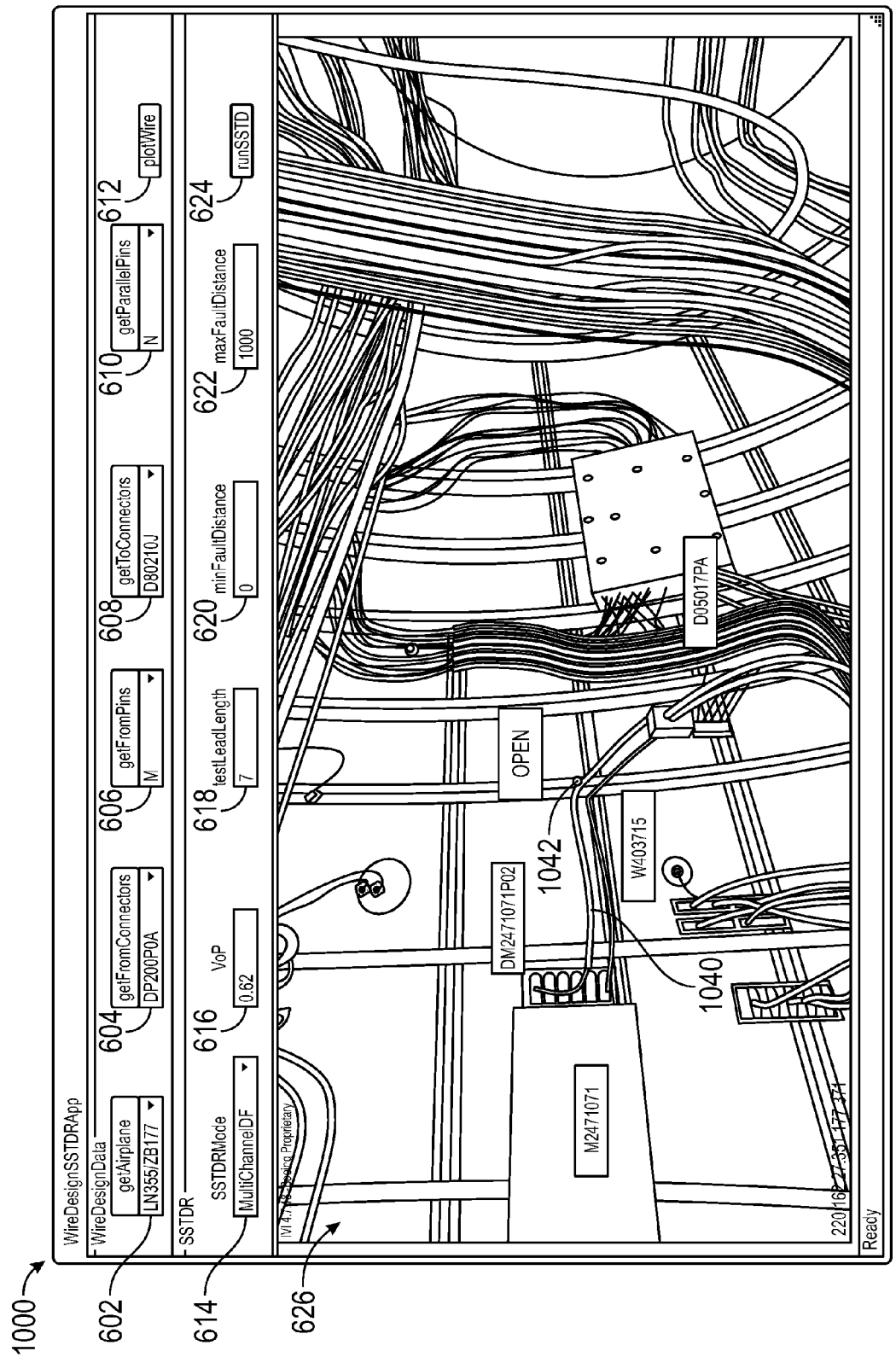
FIG. 10 depicts an embodiment of a GUI usable for SSTDR and design data wire testing including a detailed three-dimensional representation of a vehicle.

Referring to FIG. 10, an embodiment of a GUI 1000 usable for SSTDR and design data wire testing is depicted. The GUI 1000 may include a more detailed three-dimensional depiction 940 of a vehicle, including an indication 1040 of a particular wire that includes a failure and an indication 1042 of the location of the failure. As depicted in FIG. 10, the location of the failure may also be labelled with a failure type.

Although various embodiments have been shown and described, the present disclosure is not so limited and will be understood to include all such modifications and variations are would be apparent to one skilled in the art.

What is claimed is:
1. A system comprising:
a spread-spectrum time-domain reflectometry (SSTDR) device selectively coupled, via testing hardware, to at least one endpoint of a wire segment of a vehicle;
a design database storing wiring data, the wiring data indicating at least a length of the one or more wire segment;
a processor and a memory, the memory storing instructions that, when executed by the processor, cause the processor to:
receive the wiring data from the design database;

receive SSTDR data associated with the wire segment from the SSTDR device;

calculate a distance-to-fault based on the SSTDR data;

in response to the distance-to-fault being greater than a connection length through the testing hardware and less than a sum of the connection length and the length of the wire segment, determine that a failure has occurred within the wire segment and generate fault data indicating a failure type, a failure position, and a failure visualization; and display the fault data to a user output device.

2. The system of claim 1, wherein the testing hardware comprises:

a switching matrix coupled between the SSTDR device and the at least one endpoint;

a testing wire harness coupled between the SSTDR device and the at least one endpoint; and an electrical connector configured to couple the testing wire harness to the wire segment.

3. The system of claim 2, wherein the instructions further cause the processor to:

in response to the distance-to-fault being less than a length of an electrical path through the testing hardware, determine whether a failure occurred within the switching matrix, within the testing wire harness, or within the electrical connector.

4. The system of claim 1, wherein the instructions further cause the processor to:

in response to the failure occurring within the wire segment:

iteratively couple the SSTDR device to endpoints of additional wire segments within a same wire harness as the wire segment;

retrieve additional SSTDR data associated with each of the additional wire segments from the SSTDR device;

calculate additional distance-to-faults associated with each of the additional wire segments based on the additional SSTDR data; and determining whether additional failures have occurred within the additional wire segments.

5. The system of claim 4, wherein the instructions further cause the processor to:

in response to failures occurring in each wire segment associated with an electrical connector, generate additional fault data indicating that the electrical connector is disconnected.

6. The system of claim 4, wherein the instructions further cause the processor to:

in response to the failures occurring in fewer than each wire segment of an electrical connector, generate additional fault data indicating that one or more connection pins of an electrical connector is recessed, damaged, or swapped.

7. The system of claim 1, further comprising:

additional testing hardware selectively coupling the SSTDR device to another end point of the wire segment;

wherein the instructions further cause the processor to:

in response to the distance-to-fault being greater than the sum of the connection length and the length of the wire segment, determine that a failure has occurred within the additional testing hardware.

8. The system of claim 7, wherein the instructions further cause the processor to:

retrieve additional SSTDR data associated with the wire segment from the SSTDR device, wherein the additional SSTDR data is measured via the additional testing hardware selectively coupling the SSTDR device to a second end point;

calculate an additional distance-to-fault based on the additional SSTDR data; and determine whether the failure occurred within a switching matrix, within a wire harness, or within an electrical connector, of the additional testing hardware based on the additional distance-to-fault.

9. A non-transitory computer-readable medium storing instructions that, when executed by a processor, cause the processor to perform operations comprising:

receiving a user selection of a vehicle, a first electrical connector, a connection pin of the first electrical connector, and a second electrical connector, to identify a wire segment of the vehicle;

receiving wiring data indicating at least a length of the wire segment from a design database;

receiving SSTDR data associated with the wire segment from an SSTDR device coupled to the connection pin of the first electrical connector;

calculating a distance-to-fault based on the SSTDR data;

comparing the distance-to-fault to the length of the wire segment;

in response to the distance-to-fault being less than the length of the wire segment, generating fault data indicating a failure type, a failure position, and a failure visualization; and;

displaying the fault data to a user output device.

10. The non-transitory computer-readable medium of claim 9, wherein the operations further comprise:

generating 3-point vehicle coordinate information indicating a position of a failure based on the wiring data and on the distance-to-fault, wherein the fault data includes the 3-point vehicle coordinate information.

* * * * *